United States Patent [19]
Hutcheon

[11] 4,144,491
[45] Mar. 13, 1979

[54] FREQUENCY MEASURING APPARATUS

[75] Inventor: Robert S. Hutcheon, Goleta, Calif.

[73] Assignee: Raytheon Company, Lexington, Mass.

[21] Appl. No.: 839,133

[22] Filed: Oct. 3, 1977

[51] Int. Cl.$^2$ ............................................. G01R 23/00
[52] U.S. Cl. ....................................... 324/82; 328/134
[58] Field of Search .................... 324/79 R, 79 D, 82, 324/85; 328/133, 134, 155

[56] References Cited

U.S. PATENT DOCUMENTS

| | | | |
|---|---|---|---|
| 3,391,344 | 7/1968 | Goldberg | 328/134 |
| 3,568,067 | 3/1971 | Williford | 328/134 |
| 3,585,508 | 6/1971 | Crowther | 328/134 |
| 3,783,389 | 1/1974 | Gatlebet | 328/134 |

*Primary Examiner*—M. Tokar

*Attorney, Agent, or Firm*—Richard M. Sharkansky; Joseph D. Pannone

[57] ABSTRACT

Frequency measuring apparatus wherein a single sideband modulator is fed by an input signal, the frequency of which is to be determined, and a reference signal having a predetermined frequency $f_o$ to produce upper and lower sideband frequency signals separated in frequency by $2f_o$. A delay line shifts the phase of one of such signals $\phi$ relative to the other one of such signals, such phase shift being related to the frequency of the input signal. The signals are then combined and detected to produce a signal having a frequency $2f_o$ and a phase angle related to the phase shift $\phi$. A phase comparator, responsive to the reference signal and the later produced signal, detects the phase of the later signal thereby providing an indication of the frequency of the input signal. With such an arrangement relatively fewer and less costly devices may be used for the frequency measuring apparatus.

10 Claims, 5 Drawing Figures

FREQUENCY MEASURING APPARATUS

BACKGROUND OF THE INVENTION

This invention relates generally to frequency measuring apparatus and more particularly to instantaneous frequency measurement (IFM) devices which are adapted for use in measuring the frequency of radio frequency signals.

As is known in the art, instantaneous frequency measurement (IFM) devices are used in a variety of applications as where it is desired to measure the frequency of individual pulsed or continuous wave (CW) radio frequency input signals. These devices generally include a wide bandwidth radio frequency limiter circuit fed by the radio frequency input signals where the IFM device is to operate over a dynamic range of 50 dB or greater. The limited radio frequency signals are then fed to at least one delay line discriminator to provide an unambiguous measurement of the frequency of the input signals. Each delay line discriminator generally includes a power divider for separating the limited radio frequency signals into two quadrature channels, each channel having two electrical paths, the signal in one such path being delayed in phase with respect to the signal in the other path, such phase delay being related to the frequency of the input signals. The outputs of the two quadrature channels are combined and detected to form two baseband frequency output signals which have amplitudes which are proportional to the sine and cosine of the phase difference between the signals in the pairs of electrical paths and hence related to the frequency of the input signals.

While such an IFM device is adequate for many applications, such devices are relatively expensive because of the large number of microwave devices included for power splitting, power combining and detection. Also, poor sensitivity results because of the large number of power splits prior to detection. For example, in an IFM device of the type discussed herein where say three delay line discriminators are used, each having a different ambiguity-free frequency range over the wide band of frequencies, only one-twelfth of the input power (less insertion losses) would be delivered to each one of twelve detectors. In addition, each detector is generally followed by its own baseband amplifier, thereby introducing additional baseband noise. Also, predetection noise due to the delay line included in the delay line discriminator and the quadrature channel signal combining is uncorrelated, each detector thereby increasing the baseband noise level. Further, because the microwave limiter fed by the input signal generally limits signals having moderately high signal levels, it is sometimes necessary to amplify the input signals to such high levels and then deliberately attenuate the limiter output to return to the range of the detectors, thereby increasing the cost of the IFM device. It is also noted that such an IFM device has numerous error sources, such as independent amplitude and phase error (frequency dependent) introduced by each power divider or power combiner and imperfections in the balance and matching of the detection.

SUMMARY OF THE INVENTION

With this background of the invention it is therefore an object of this invention to provide an improved instantaneous frequency measurement device adapted for use with radio frequency signals.

This and other objects are attained generally by providing an instantaneous frequency measurement device comprising: Mixer means fed by an input signal and a reference signal for producing a pair of signals, such signals being the upper and lower sideband frequency signals separated by a fixed offset frequency, $2f_o$, related to the frequency of the reference signal; means, fed by the pair of signals, for providing a differential time delay between the upper and lower sideband frequency signals, shifting the phase of one of such sideband frequency signals an amount, $-\phi$, related to the frequency of the input signal; and, means for combining and detecting the differentially time delayed upper and lower sideband frequency signals producing a signal having a frequency related to the frequency, $2f_o$, and a phase angle related to the amount of phase shift, $-\phi$.

BRIEF DESCRIPTION OF THE DRAWINGS

The above-mentioned and other features of the invention will become more apparent by reference to the following description taken together in conjunction with the accompanying drawings, in which.

DESCRIPTION OF THE PREFERRED EMBODIMENTS

Figure 1:
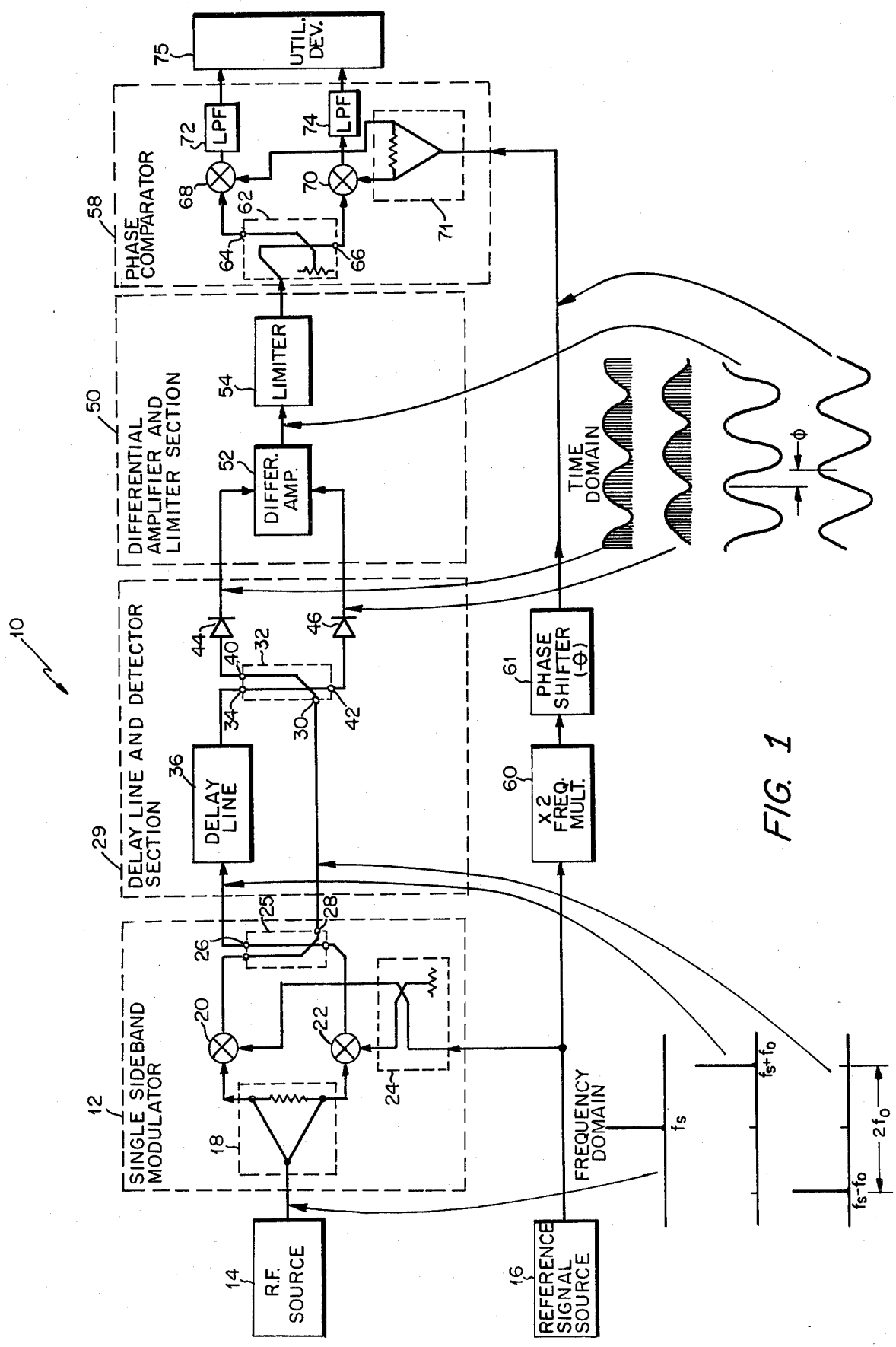
FIG. 1 is a block diagram of an instantaneous frequency measurement device according to the invention.

Referring now to FIG. 1, an instantaneous frequency measurement device 10 is shown to include a single sideband modulator 12 adapted for coupling to a radio frequency input signal source 14 and a reference signal source 16, as shown. The device 10 is adapted to measure the frequency, $f_s$, of the input signal produced by the source 14. The frequency $f_o$ of the reference signal produced by the source 16 is relatively small compared to the frequency $f_s$. Here, for example, the frequency $f_o$ is 20 MHz and the frequency $f_s$ is a frequency in a band which extends from $f_L = 2500$ MHz to $f_H = 4000$ MHz. The single sideband modulator 12 includes a 2:1 power divider 18 which couples the input signal to a pair of mixers 20, 22, as shown. A 90° hybrid coupler 24 is provided to produce a pair of quadrature signals, $e^{+j(2\pi f_o t)}$ and $e^{+j(2\pi f_o t - \pi/2)}$ to mixers 20, 22, respectively. It follows then that mixers 20, 22 produce a pair of signals, each having upper and lower sideband frequency signals separated by a fixed offset frequency, i.e. the frequency $2f_o$. The pair of signals is fed to a 90° hybrid coupler 25 to produce a pair of signals at output ports 26, 28 which may be represented as $$e^{+j[2\pi(f_s+f_o)t - \pi/2]} \text{ and}$$
$$e^{+j[2\pi(f_s-f_o)t]},$$

respectively.

The signals produced by the single sideband modulator 12 are fed to a delay line and detector section 29, as shown. In particular, output port 28 is coupled to port 30 of 90° hybrid coupler 32 and port 26 is coupled to port 34 of such coupler 32 through a delay line 36. Here the electrical length of the delay line 36 is selected so that the phase of the signals at port 34 will change, linearly, through $2\pi$ radians as the frequency of the signal at such port 34 varies linearly over the frequency band $B = f_H - f_L$, here 1500 MHz (FIG. 2), that is, $K = 2\pi/B$, here $2\pi/(1500 \times 10^6)$, the delay line length being $1/(1500 \times 10^6)$. Generally, however, in order to avoid any undesired ambiguities at the extremes of the band, the phase shift will be made less than $2\pi$ radians over the band. It follows, then, that the phase of the signals at port 34 will be related (i.e. substantially proportionally) to the frequency of such signals (i.e. $f_s + f_o$) and hence related (i.e. substantially linearly related) to the frequency of the input signal, i.e. the frequency $f_s$. The signals at ports 34, 30 may be represented as $$e^{j2\pi[(f_s+f_o)t - \pi/2 - \phi]} \text{ and}$$

$$e^{j[2\pi(f_s-f_o)t]},$$

respectively.

That is, the delay line 36 provides a differential time delay between the upper sideband frequency signals (i.e. the signals at port 34) and the lower sideband frequency signals (i.e. the signals at port 30), shifting the phase of the upper sideband frequency signals an amount, $-\phi$, related to (i.e. substantially linearly related to) the frequency, $f_s$, of the input signal.

The differentially delayed upper and lower sideband frequency signals are combined in the 90° hybrid coupler 32 to produce a pair of signals at ports 40, 42, which may be represented as:

$$e^{+j[2\pi(f_s-f_o)t]} + e^{+j[2\pi(f_s+f_o)t + \pi - \phi]} \text{ and}$$

$$e^{+j[2\pi(f_s+f_o)t - \pi/2 - \phi]} + e^{+j[2\pi(f_s-f_o)t - \pi/2]},$$

respectively.

The signals at ports 40, 42 are fed to detectors 44, 46 to produce a pair of signals which may be represented as $$e^{+j[2\pi(2f_o)t + \pi - \phi]} \text{ and}$$

$$e^{+j[2\pi(2f_o)t - \phi]},$$

respectively.

Additionally, DC components and harmonic components of $2f_o$ are produced by the detector; however, as further described below, these are rejected for reasons to be discussed. It is noted that the desired output at frequency $2f_o$ is obtained independent of the power law of the detector used. Therefore, either a square law or linear detector may be used for detectors 44, 46.

Figure 2:
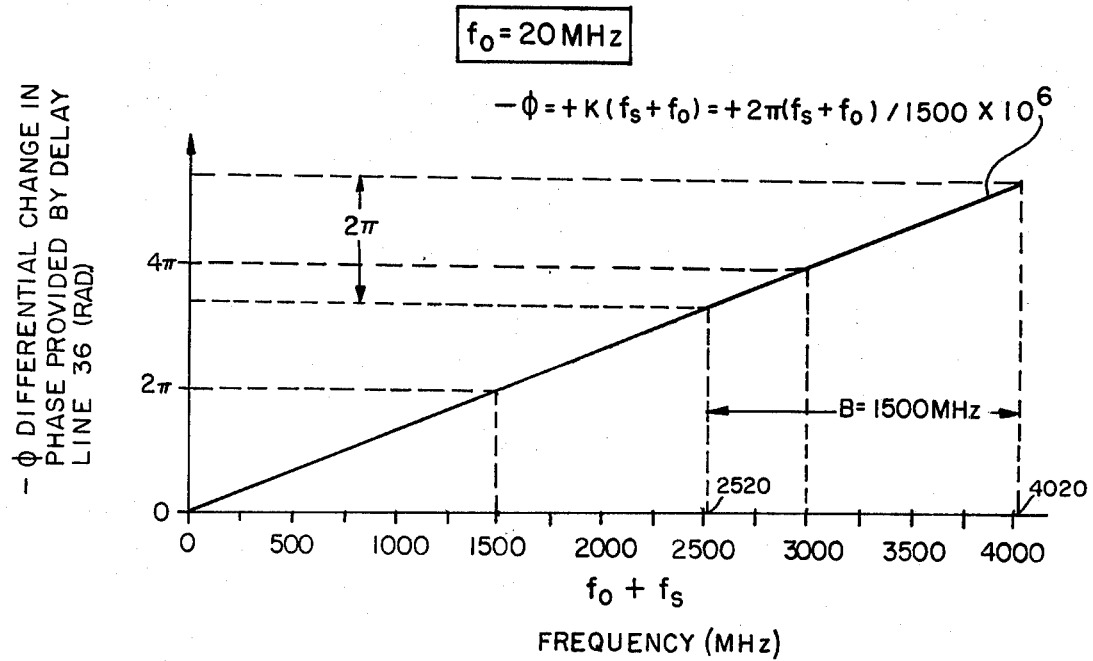
FIG. 2 is a curve useful in understanding the instantaneous frequency measurement device of FIG. 1.

It is noted that the signals at the outputs of detectors 44, 46 have the same frequency, $2f_o$, have a 180° phase difference and a phase $-\phi$ (or $\pi - \phi$) which is a function of the frequency $f_s$ of the input signal, i.e.

$$\phi = -K(f_s + f_o) = -(2\pi/B)(f_s + f_o)$$

where K is a proportionality constant related to the electrical length of the delay line 36. Further, the electrical length of the delay line 36 is selected so that the phase shift $-\phi$ varies nearly $2\pi$ radians over the operating band of the instantaneous frequency measurement device 10, (i.e. here 2500 to 4000 MHz), (FIG. 2). It is noted that the signals produced at the output of the delay line and detector section 29 have a relatively low frequency, i.e. $2f_o$, here 40 MHz, and therefore the remaining signal processing is accomplished using relatively low frequency, inexpensive components.

The signals produced by the delay line and detector section 29 are fed to a differential amplifier and limiter section 50, as shown. Such section 50 includes a differential amplifier 52 fed by the signals produced at the outputs of detectors 44, 46, respectively, as shown. The differential amplifier 52 removes any DC or harmonic components of $2f_o$ on the signals produced by detectors 44, 46 and reinforces the components having the frequency $2f_o$ produced by such detectors. The signal produced at the output of differential amplifier 52 may be represented as $$e^{+j[2\pi(2f_o)t - \phi]}$$

The signal produced at the output of differential amplifier 52 is fed to a limiting amplifier 54, as shown. Such limiting amplifier 54 amplifies and limits the signals fed thereto to produce a constant amplitude signal, having the frequency $2f_o$, over a wide input signal level dynamic range, say a 50 dB or greater dynamic range. That is, the 90° hybrid coupler 32, detectors 44, 46, differential amplifier 52 and limiting amplifier 54 combine the differentially time delayed upper and lower sideband frequency signals at ports 30, 34, producing a signal at the output of limiting amplifier 54 which has a frequency $2f_o$ related to the frequency of the reference signal and a phase angle related to the phase shift $-\phi$, such phase shift $-\phi$ being related to the frequency, $f_s$, of the input signal.

The signal produced by the limiting amplifier 54 is fed to a phase comparator section 58. Also fed to such phase comparator section 58 is a signal having a frequency $2f_o$. Such signal having frequency $2f_o$ is shown as being produced by passing the reference signal produced by source 16 through an $\times 2$ frequency multiplier 60. The signal produced by multiplier 60 is fed to a phase shifter 61. Such phase shifter 61 provides a phase shift $\theta$ to such produced signal. Here $\theta = -2\pi[(f_L + f_o)/B]$ radians. Therefore, the signal produced at the output of phase shifter 61 serves as a reference signal which is in phase with the signal produced at the output of limiter 54 at the frequency $f_L$. Such reference signal has the same frequency as the signal produced by limiting amplifier 54 and is fed to phase comparator section 58 to produce a pair of DC signals having levels proportional to $\sin(-\phi+\theta)$ and $\cos(-\phi+\theta)$. In particular, referring to FIG. 1, phase comparator section 58 includes a 90° hybrid junction 62 fed by the limiting amplifier 54 to produce, at ports 64, 66, signals which may be represented as $$e^{+j[2\pi(2f_o)t - \pi/2 - \phi + \theta]} \text{ and}$$

$$e^{+j[2\pi(2f_o)t - \phi - \theta]},$$

respectively. The signals at ports 64, 66 are fed to mixers 68, 70, respectively, as shown. The signal produced by phase shifter 61 is fed to mixers 68, 70 through 2:1 power divider 71, as shown. It follows then that the signals produced by mixers 68, 70, after passing through low pass filters 72, 74, respectively, may be represented as:

$$\sin(\phi - \theta) \text{ and}$$

$$\cos(\phi - \theta),$$

respectively.

The signals produced by the phase comparator 58 are fed to a utilization device 75, here a computer which includes a pair of analog-to-digital converters (A/D converters) (not shown) for converting the signals produced by comparator 58 to corresponding digital words, and a read only memory (ROM) (not shown) which converts such digital words according to the equation $$\phi - \theta = \tan^{-1} \frac{\sin(\phi - \theta)}{\cos(\phi - \theta)}$$

to produce a digital word representative of the phase angle $(\phi - \theta)$ The computer, not shown, calculates the frequency of the input signal according to $$f_s = \frac{(\phi - \theta)}{K} + f_L$$

where digital words representative of $f_o$, $f_L$ and K are stored in such computer. The digital word representative of $f_s$ is here displayed on a conventional display, not shown, included in the utilization device 75. It is noted that the phase shift $\theta$ was added to enable the frequency $f_s$ to be $f_L$ when $\phi - \theta = 0$.

Figure 3:
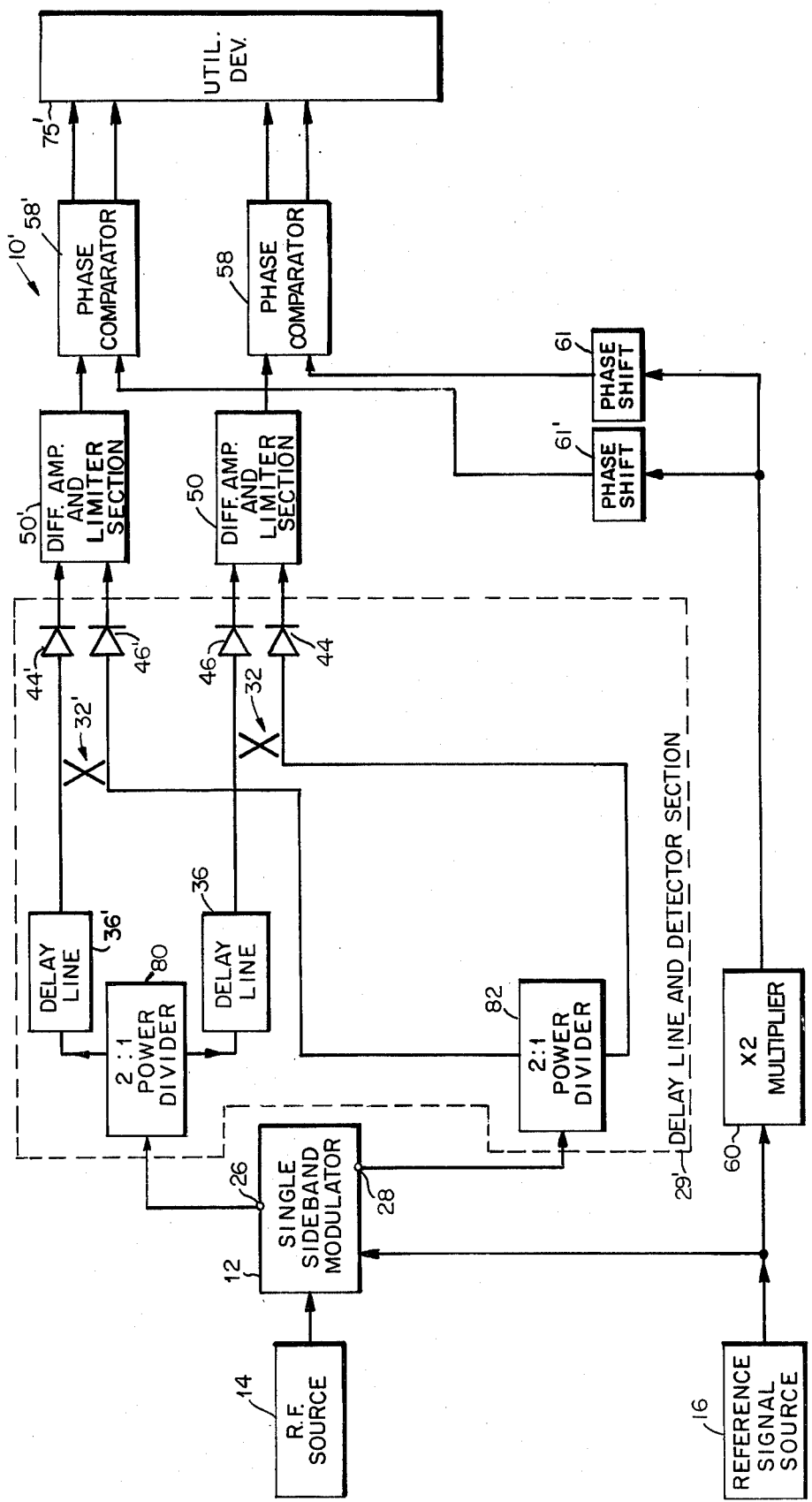
FIG. 3 is a block diagram of an alternative embodiment of an instantaneous frequency measurement device according to the invention.

Referring now to FIG. 3, an alternative embodiment of the invention is shown to include an instantaneous frequency measurement device 10'. It is noted that elements identical to those described in connection with FIG. 1 are shown with common numerical notation. The device 10' is designed to resolve the frequency of the source 14, i.e. the frequency $f_s$, to a greater precision than obtainable with the IFM device 10 (FIG. 1). Here the IFM device 10' (FIG. 3) includes a delay line and detector section 29' which is fed by the single sideband modulator 12. The delay line and detector section 29' includes a pair of power dividers, here a pair of 2:1 power dividers 80, 82 coupled to ports 26, 28 of single sideband modulator 12 (FIG. 1), respectively as shown. A pair of signals produced at the output of power divider 80 is fed to a pair of delay lines 36, 36', as shown. Delay line 36 is identical to the delay line 36 of FIG. 1 and the characteristics of such delay line are shown again in FIG. 4 by the curve labeled 84. The electrical length of delay line 36' is selected so that the phase signals fed to such line will change, linearly, through nearly $4\pi$ radians as the frequency of such signal varies linearly over the frequency level $B = f_H - f_L$, here 2500 MHz to 4000 MHz. That is, $$\phi_1 = -4\pi \frac{f_s + f_o}{B} = -4\pi \frac{f_s + f_o}{1500 \times 10^6}, \text{ and}$$

Figure 4:
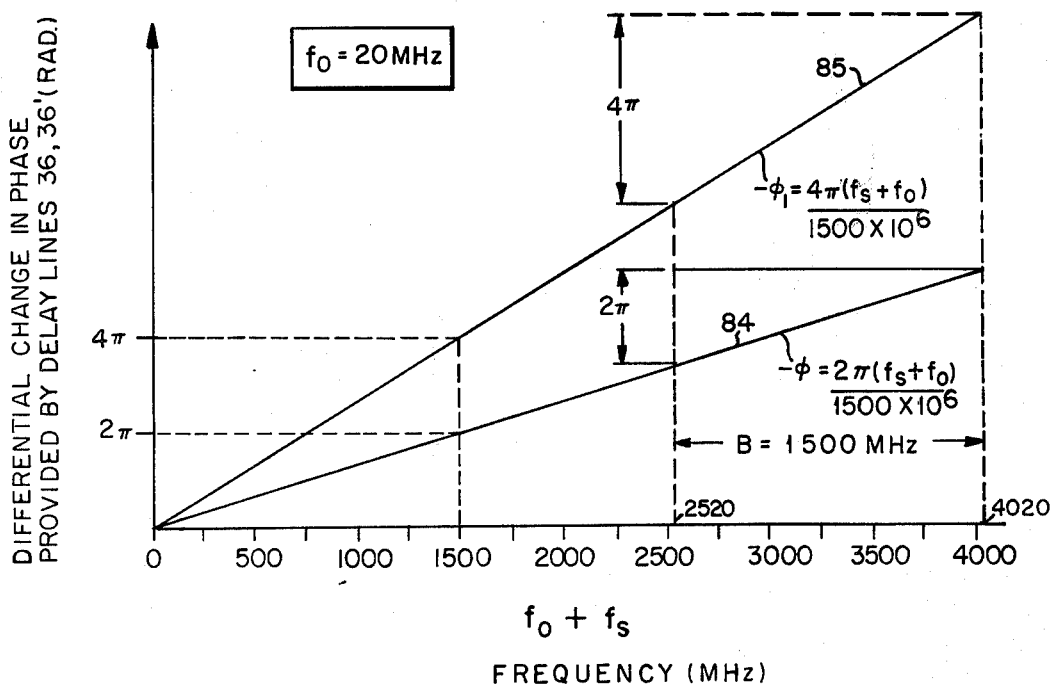
FIG. 4 is curves useful in understanding the instantaneous frequency measurement device of FIG. 3.

$K_1 = 4\pi/B$. The characteristics of such delay line 36' are shown in FIG. 4 by the line labeled 85. The signals produced by delay line 36 and at one output port of power divider 82 and the signals produced by delay line 36' and at the other output port of power divider 82 are fed to a pair of 90° hybrid junctions 32, 32', respectively, as shown. Hybrid junction 32 is coupled to a pair of detectors 44, 46, a differential amplifier and limiter network 50 and a phase comparator section 58 as discussed in connection with FIG. 1. The output of phase comparator section 58 therefore produces a pair of signals which may be represented as $\sin(\phi - \theta)$ and $\cos(\phi - \theta)$ as discussed. The signals produced at the output of hybrid junction 32' are fed to a pair of detectors 44', 46', a differential amplifier and limiter section 50' (equivalent to section 50) and a phase comparator section 58' (equivalent to section 58'). Also fed to phase comparator section 58' is a reference signal having a frequency $2f_o$ and a phase angle $\theta_1$ provided by phase shifter 61', such phase angle $\theta_1$ being here $$\theta_1 = -4\pi[f_l + f_o]/b] \text{ radians.}$$

Therefore, the signal produced at the output of phase shifter 61' serves as a reference signal which is in phase with the signal produced at the output of differential amplifier and limiter section 50' at the frequency $f_L$. The output of phase comparator section 58' therefore produces a pair of signals which may be represented as $$\sin(\phi_1 - \theta_1) = \sin[2(\phi - \theta)]$$

$$\cos(\phi_1 - \theta_1) = \cos[2(\phi - \theta)]$$

The signals produced by phase comparator 58' are fed to utilization device 75', here a computer which includes a pair of A/D converters (not shown) for converting the signals produced by comparators 58, 58' to corresponding digital words and a ROM (not shown) produces a pair of digital words representative of the phase angles $(\theta - \phi)$ and $(\theta_1 - \phi_1)$, respectively.

Figure 5:
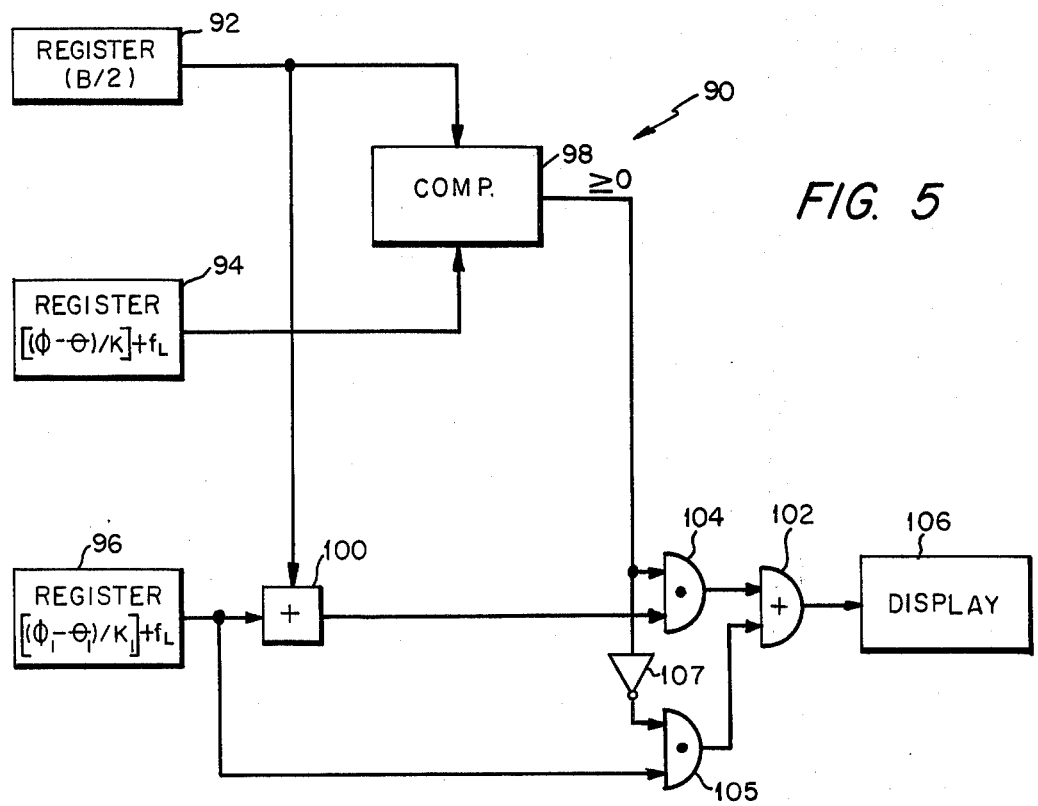
FIG. 5 is a logic section used in the IFM device of FIG. 3.

The frequency $f_s$ is then calculated in the following manner: if $[(\phi - \theta)/K] + f_L - B/2$ is positive the frequency $f_s = B/2 + [(\phi_1 - \theta_1)/K_1] + f_L$ and, if negative, $f_s = [(\phi_1 - \theta_1)/K_1] + f_L$. Such calculation is here implemented in a logic section 90 (FIG. 5) which is included in utilization device 75'. A register 92 stores a digital word representative of B/2, a register 94 stores a digital word representative of $[(\phi - \theta)/K] + f_L$, as calculated by the computer in utilization device 75' and a register 96 stores a digital word representative of $[(\phi_1 - \theta_1)/K_1] + f_L$ as calculated by such computer. Register 92 is fed to a comparator 98 and to an adder 100. Register 94 is fed to comparator 98. Register 96 is fed to adder 100. The output of comparator 98 is fed to AND gate means 104 along with the output of the adder 100 and to the AND gate means 105 through inverter 107. The output of AND gate means 104 and 105 feed OR gate means 102. The output of OR gate means 102 feeds a display 106, as shown. Therefore, in operation, if the contents of register 94 are greater than (or equal to) the contents of register 92, the output of comparator 98 goes high and enables the output of adder 100 to pass to display 106. Conversely, if the contents of register 94 are less than the contents of register 92, the contents of register 96 pass to display 106.

Having described preferred embodiments of the invention, numerous modifications and variations will now become readily apparent to those of skill in the art. For example, frequency bands other than the frequency band herein described may be used. Further, the frequency of a signal in a selected frequency band may be further resolved by similarly increasing the number of delay lines used in the delay line and detector section and appropriately increasing the number of sections 50, 58 and modify the utilization device 75. Further, a source 16 which produces a reference signal having a frequency $2f_o$ may be used where the $\times 2$ multiplier 60 is removed and a divide by 2 circuit is included between the reference signal source 16 and the reference signal to mixers 20, 22 (FIG. 1). It is felt, therefore, that the invention should not be restricted to the disclosed embodiments, but should be limited only by the spirit and scope of the appended claims.

What is claimed is:

1. In combination:
    (a) mixer means fed by an input signal and a reference signal for producing upper and lower sideband frequency signals separated in frequency by a fixed offset frequency;
    (b) means fed by the upper and lower sideband signals, for providing a differential time delay between the upper and lower sideband frequency signals, shifting the phase of one of such sideband frequency signals an amount, $-\phi$, related to the frequency of the input signal; and
    (c) means for combining and detecting the differential time delayed upper and lower sideband frequency signals producing a signal having a frequency related to the offset frequency and a phase angle related to the phase shift $-\phi$.

2. The combination recited in claim 1 including a phase comparator means fed by the signal produced by the combining and detecting means and the reference signal for detecting the phase angle of the former signal.

3. The combination recited in claim 2 wherein the phase comparator means includes means for producing a pair of quadrature output signals the levels of which are related to the phase shift $-\phi$.

4. The combination recited in claim 2 wherein the combining and detecting means includes a pair of detectors fed by the differential phase delay providing means.

5. The combination recited in claim 4 wherein the combining and detecting means includes a differential amplifier fed by the pair of detectors.

6. The combination recited in claim 5 wherein the combining and detecting section includes a limiter fed by the differential amplifier.

7. Apparatus for determining the frequency of an input signal, comprising:
    (a) a reference signal source for producing a reference signal;
    (b) means for mixing the input signal and the reference signal producing a pair of signals, such signals being the upper and lower sideband frequency signals separated by a fixed offset frequency $2f_o$ related to the frequency of the reference signal;
    (c) delay line means fed by the mixing means for shifting the phase of one of the sideband frequency signals an amount $-\phi$ relative to the other one of the sideband frequency signals, such phase shift $-\phi$ being related to the frequency of the input signal;
    (d) combination and detecting means fed by the delay line means, for producing a signal having a frequency related to the fixed offset frequency $2f_o$ and a phase shift related to the phase shift $-\phi$;
    (e) means, responsive to the reference signal and the signal produced by the combining and detecting means, for detecting the phase shift of such signal.

8. The apparatus recited in claim 7 wherein the combining and detecting means includes detector means for producing a pair of signals each having a frequency related to the fixed offset frequency $2f_o$ and a relative phase shift related to the phase shift $-\phi$.

9. The apparatus recited in claim 8 wherein the combining and detecting means includes a differential amplifier fed by the detector means and having an output coupled to the phase detecting means and having an output coupled to the phase detecting means.

10. The apparatus recited in claim 9 including a limiter coupled between the differential amplifier and phase detecting means.

* * * * *

UNITED STATES PATENT OFFICE
CERTIFICATE OF CORRECTION

Patent No. 4,144,491      Dated March 13, 1979

Inventor(s) Robert S. Hutcheon

It is certified that error appears in the above-identified patent and that said Letters Patent are hereby corrected as shown below:

Column 4, line 56, replace $e^{+j[2\pi(2f_o)t - \phi - \theta]}$ with $e^{+j[2\pi(2f_o)t - \phi + \theta]}$ Column 5, line 48, after "phase" insert -- of --

Signed and Sealed this

Eighteenth Day of March 1980

[SEAL]

Attest:

SIDNEY A. DIAMOND

*Attesting Officer*      *Commissioner of Patents and Trademarks*